United States Patent
Wanner et al.

(10) Patent No.: US 9,877,380 B2
(45) Date of Patent: Jan. 23, 2018

(54) ARRANGEMENT AND METHOD FOR ELECTROMAGNETIC SHIELDING

(71) Applicants: Martin Wanner, Elchingen (DE); Meik Wilhelm Widmer, Elchingen (DE); Thomas Woerz, Langenau (DE)

(72) Inventors: Martin Wanner, Elchingen (DE); Meik Wilhelm Widmer, Elchingen (DE); Thomas Woerz, Langenau (DE)

(73) Assignee: E. SOLUTIONS GmbH (DE)

( * ) Notice: Subject to any disclaimer, the term of this patent is extended or adjusted under 35 U.S.C. 154(b) by 0 days.

(21) Appl. No.: 15/010,599

(22) Filed: Jan. 29, 2016

(65) Prior Publication Data

US 2016/0227642 A1 Aug. 4, 2016

(30) Foreign Application Priority Data

Jan. 30, 2015 (DE) .......................... 10 2015 001 148

(51) Int. Cl.
*H05K 7/20* (2006.01)
*H05K 1/02* (2006.01)
(Continued)

(52) U.S. Cl.
CPC ......... *H05K 1/0216* (2013.01); *H05K 9/0032* (2013.01); *H01L 2224/16225* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 2001/0010624 A1* | 8/2001 | Katsui ..................... H01L 23/40 361/709 |
| 2003/0184976 A1* | 10/2003 | Brandenburg ......... H05K 5/065 361/719 |

(Continued)

FOREIGN PATENT DOCUMENTS

JP 2012-191033 A 10/2012

*Primary Examiner* — Anthony Haughton
*Assistant Examiner* — Razmeen Gafur
(74) *Attorney, Agent, or Firm* — Tarolli, Sundheim, Covell & Tummino LLP

(57) ABSTRACT

An arrangement for electromagnetic shielding of an electronic component attached to a substrate is described. The arrangement comprises an electrically conductive frame which is attached to the substrate in such a way that the frame frames the component. The arrangement further comprises an electrically conductive covering which is attached at least to a portion of a top side of the component, and which is electrically conductively attached at least to a portion of the frame. Furthermore, a method for electromagnetic shielding of the electronic component attached to the substrate and also a computer program product for carrying out the method are described.

26 Claims, 6 Drawing Sheets

(51) Int. Cl.
    *H05K 9/00*      (2006.01)
    *H01L 23/473*    (2006.01)

(52) U.S. Cl.
    CPC .. *H01L 2224/73253* (2013.01); *H05K 1/0209* (2013.01); *H05K 2201/066* (2013.01); *H05K 2201/0715* (2013.01); *H05K 2201/2018* (2013.01); *Y10S 901/02* (2013.01)

(56) References Cited

U.S. PATENT DOCUMENTS

| | | | | |
|---|---|---|---|---|
| 2003/0189814 A1* | 10/2003 | Kato | H01L 23/544 | 361/715 |
| 2005/0024838 A1* | 2/2005 | Maxwell | H01L 23/5385 | 361/782 |
| 2005/0185381 A1* | 8/2005 | Ono | H05K 9/0015 | 361/715 |
| 2005/0185383 A1* | 8/2005 | Petrella | H05K 7/209 | 361/719 |
| 2006/0044762 A1* | 3/2006 | Kikuchi | H01L 25/162 | 361/704 |
| 2006/0139887 A1* | 6/2006 | Kameda | H01L 23/427 | 361/704 |
| 2006/0187645 A1* | 8/2006 | Numata | H05K 7/2049 | 361/704 |
| 2007/0211436 A1* | 9/2007 | Robinson | H01L 23/552 | 361/719 |
| 2008/0232052 A1* | 9/2008 | Kim | H05K 1/0204 | 361/679.05 |
| 2008/0285238 A1* | 11/2008 | Gilliland | H01L 23/552 | 361/710 |
| 2009/0027859 A1* | 1/2009 | Giacoma | H01L 21/50 | 361/709 |
| 2009/0273902 A1* | 11/2009 | Kato | H02B 1/50 | 361/692 |
| 2010/0097757 A1* | 4/2010 | Wang | H05K 9/0032 | 361/693 |
| 2011/0007479 A1* | 1/2011 | Tam | H01L 25/0652 | 361/721 |
| 2011/0176279 A1* | 7/2011 | Zhao | H01L 21/4878 | 361/720 |
| 2011/0194249 A1* | 8/2011 | Nakasaka | H01L 23/473 | 361/689 |
| 2012/0106085 A1* | 5/2012 | Yamazaki | G01J 5/029 | 361/705 |
| 2012/0218718 A1* | 8/2012 | Wertz | H01L 23/4338 | 361/718 |
| 2012/0281360 A1* | 11/2012 | Nicol | H05K 7/20127 | 361/704 |
| 2012/0300405 A1* | 11/2012 | Weeber | H01L 23/552 | 361/709 |
| 2013/0044436 A1* | 2/2013 | Kovatchev | H05K 1/0218 | 361/720 |
| 2013/0088836 A1* | 4/2013 | Kuroda | H01L 23/42 | 361/700 |
| 2013/0208422 A1* | 8/2013 | Hughes | H05K 7/20445 | 361/700 |
| 2013/0235528 A1* | 9/2013 | Lee | H05K 7/20418 | 361/704 |
| 2013/0286592 A1* | 10/2013 | Tsuduki | H01L 23/055 | 361/707 |
| 2013/0322021 A1* | 12/2013 | Ohoka | H05K 9/0007 | 361/714 |
| 2014/0048326 A1 | 2/2014 | Lin et al. | | |
| 2014/0085818 A1* | 3/2014 | Lee | H05K 5/0213 | 361/690 |
| 2014/0268578 A1* | 9/2014 | Dolci | H05K 9/0049 | 361/719 |
| 2015/0043162 A1* | 2/2015 | Chen | H01L 23/3675 | 361/679.55 |

* cited by examiner

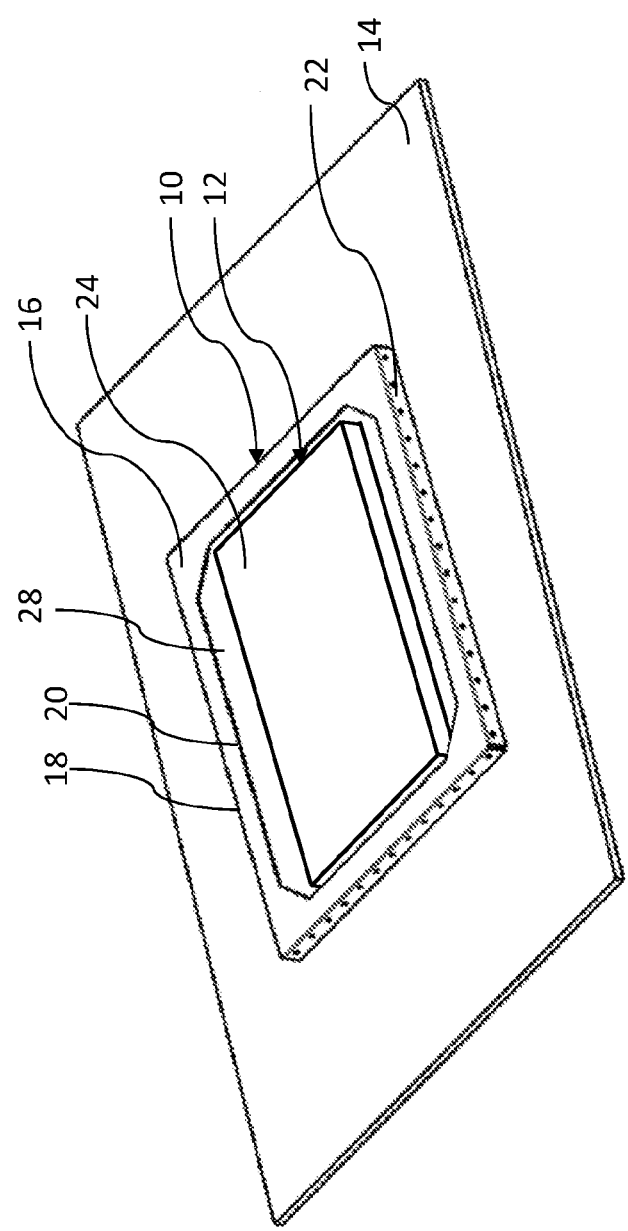

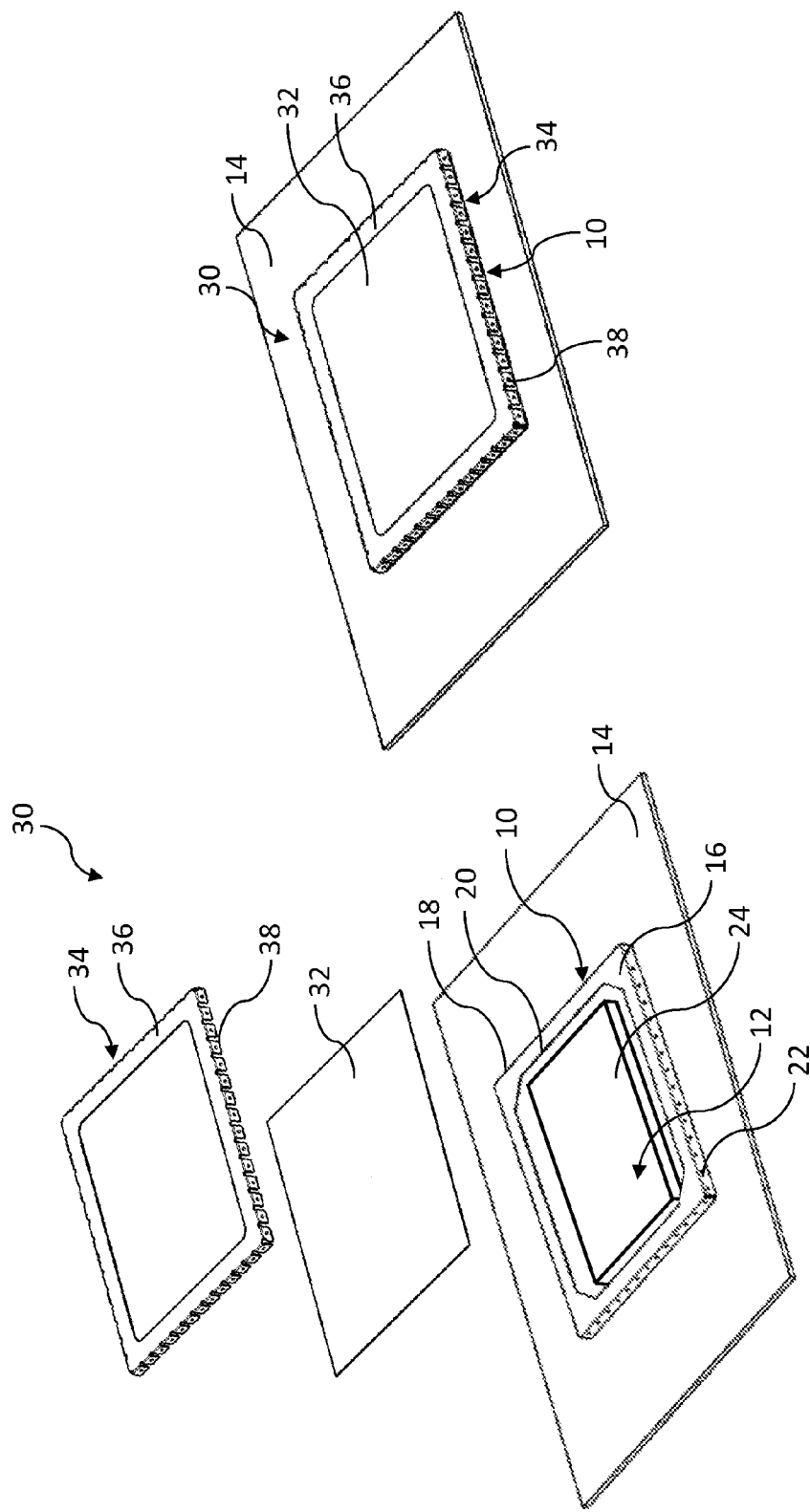

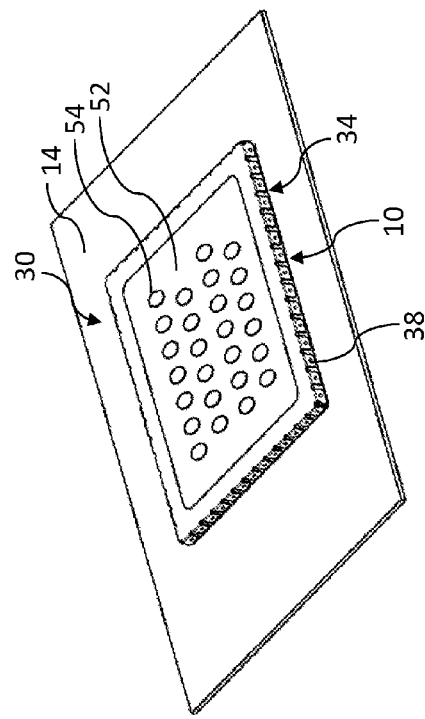
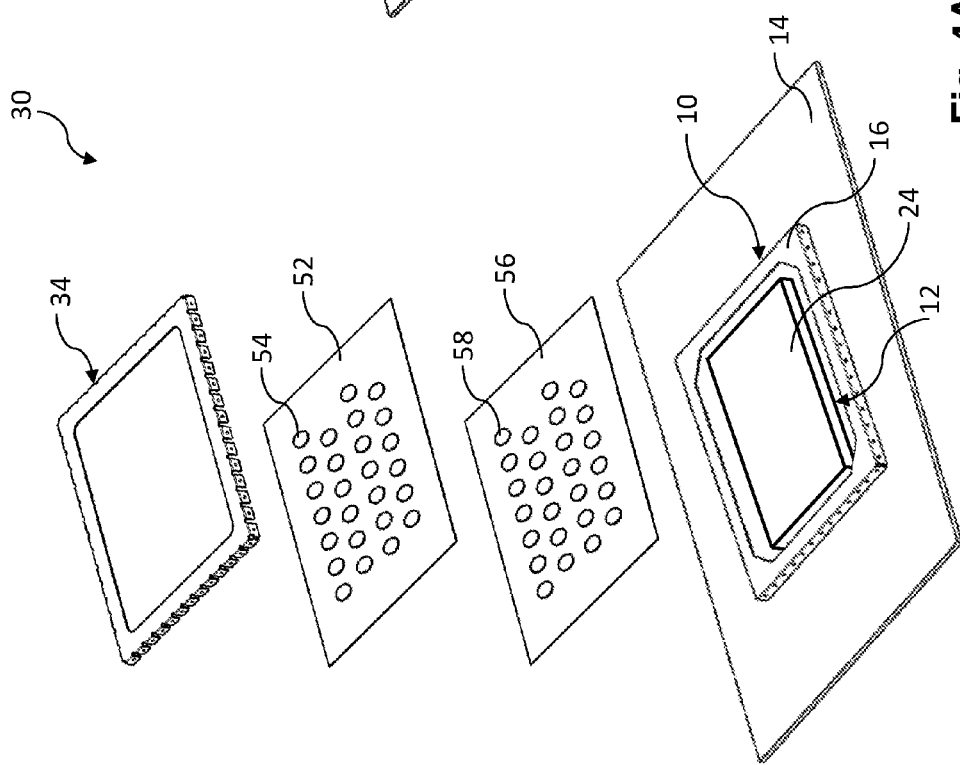
Fig. 4B
Fig. 4A

ARRANGEMENT AND METHOD FOR ELECTROMAGNETIC SHIELDING

TECHNICAL FIELD

The present disclosure relates generally to the technical field of electromagnetic shielding. It relates in particular to an arrangement and to a method for electromagnetic shielding of an electronic component attached to a substrate.

BACKGROUND

The market for electronic devices is growing continuously. At present, an increased use of electronic devices can be seen especially in motor-vehicle construction. The electronic devices are in this case equipped with processor systems having higher and higher clock frequencies, in order to meet the increasing power requirements of the devices. The problems of electromagnetic interference (EMI) and the energy losses in the form of heat also increase, however, with the clock frequency.

EMI refers to malfunctions of an electronic component of a device caused by the energy in the form of electromagnetic radiation emitted by another electronic component. In many fields, such as, for example, in motor vehicles, the malfunctions can lead to safety-critical situations. In order to avoid such malfunctions, the components are separated from one another by electromagnetic shielding devices.

An electromagnetic shielding is often realised as a device having a plurality of parts. Such a device comprises, for example, a frame, which laterally surrounds the component attached to a printed circuit board acting as substrate, and also a rigid lid, which is attached to the frame and covers the top side of the component facing away from the printed circuit board.

When attaching the lid to the frame, it should normally be ensured that the top side of the component does not project beyond a top side of the frame. In order to reliably preclude a projection of the component beyond the top side of the frame despite tolerance-related height variations when attaching the component to the printed circuit board (e.g. in the context of a reflow process), a projection of the top side of the frame beyond the top side of the component is customarily accepted in the prior art. Owing to the height difference resulting therefrom, a gap is formed between the component and the lid of the electromagnetic shielding device. In order to guarantee sufficient dissipation of the heat emanating from the electronic component, the gap is thermally bridged by a heat-conducting medium (e.g. a heat-conducting paste).

What goes against the described structure of electronic component, heat-conducting medium and electromagnetic shielding device is the requirement for ever-greater reduction of the overall height of the electronic devices while increasing the power.

SUMMARY

An improved solution for electromagnetic shielding of an electronic component attached to a substrate is to be provided.

According to a first aspect, an arrangement for electromagnetic shielding of an electronic component attached to a substrate is provided. The arrangement comprises an electrically conductive frame which is attached to the substrate in such a way that the frame frames the component. The arrangement further comprises an electrically conductive covering which is attached at least to a portion of a top side of the component and which is electrically conductively attached at least to a portion of the frame.

The arrangement can be part of an electronic control unit (ECU). The electronic control unit can be provided for installation in a motor vehicle. Other fields of application are also conceivable.

The covering can be attached at least to a portion of a top side of the frame. Additionally or alternatively thereto, the covering can be attached at least to a portion of side faces of the frame. The attaching can result in the covering being fastened to the frame and to the component.

It can be provided that the covering is flexibly formed. Thus, the covering can, for example, be bendable. The flexibility can depend on a property of the covering (e.g. on a material and on a thickness of the covering).

The covering can have a thickness of at most 250 μm or at most 100 μm, in particular a thickness of approximately 70 μm. The covering can be or comprise a metal foil. In this case, the metal foil can, for example, contain copper or consist of copper.

The covering can completely cover a region covered by it. Alternatively thereto, it can be provided that the covering has at least one aperture. The at least one aperture can leave open a subregion in the region covered by the covering, which subregion is not covered by the covering. The non-covered region or the non-covered regions can lie at least partly in the region of the component. In other words, surface regions of the component can be left open by the covering. The at least one aperture can be configured in the shape of an oval (e.g. a circle) or a polygon (e.g. a square).

If the covering has a plurality of apertures, it can be provided that the covering comprises webs lying between the apertures. The apertures can be arranged, for example, on a single line or on lines running substantially parallel to one another (e.g. in the manner of a matrix).

The plane in which the frame top side lies can be substantially identical to a plane in which the component top side lies. In this case, the covering attached at least to the portion of the top side of the component and at least to the portion of the frame can extend substantially in one plane.

The component top side can also be arranged with a certain (e.g. tolerance-related or intentional) height offset parallel to the frame top side. The covering can bridge the height offset between the top side of the component and the top side of the frame. In this case, it can be provided that the covering bridges a height offset between approximately 0 μm and 500 μm. It can, for example, also be provided that the covering bridges a height offset up to 150 μm or up to 300 μm. The height offset can be caused by a projection of the component beyond the frame—or vice versa.

The covering can be attached without a gap to the at least one portion of the top side of the component. At least in this case the attachment of the covering to the top side of the component can be effected by means of an adhesive. The adhesive can be an electrically and/or a thermally conductive adhesive. Additionally or alternatively thereto, the covering can be attached by means of an (at least electrically conductive) adhesive to the at least one portion of the frame.

An adhesive layer thickness extending between the component top side and the covering can correspond to or be different from an adhesive layer thickness extending between the frame top side and the covering. The adhesive layer thickness can assume generally values between 2 μm and 150 μm, in particular between approximately 10 μm and 75 μm.

It can be provided that the covering covers substantially the entire top side of the component. At least in this case, it can be provided that the covering is also thermally conductively formed. The covering can further be attached substantially to the entire top side of the component. For dissipation of a heat emanating from the component via the covering, the attachment of the covering to the top side of the component can be effected by means of a thermally conductive adhesive or a thermally and electrically conductive adhesive.

Alternatively thereto, it can be provided that the covering does not cover a region of the top side of the component which is spaced from a border of the component top side. In this case, the top side of the component, at least in the portion to which the covering is not attached, can be electrically conductively formed and be in electrical contact with the covering. Furthermore, the covering can be attached by means of an electrically conductive adhesive or an electrically and thermally conductive adhesive to the top side of the component. The electromagnetic shielding of the electronic component can, in this case, at least be assisted by virtue of the electrical contact between the electrically conductive component top side and the covering and also between the covering and the frame.

Furthermore, the covering can cover substantially the entire top side of the frame. A region of the frame top side which is not covered by the covering can run, for example, along an outer border of the frame top side. The region of the frame top side which is not covered by the covering can in this case comprise, for example, between ⅓ and ⅕ of a frame width extending starting from the outer border to the inner border of the frame top side.

The top side of the frame can be formed by edges, facing away from the substrate, of side faces of the frame. The top side of the frame can also be configured as a flange extending from the side faces of the frame inwards. The flange can in this case extend substantially perpendicularly to the frame side faces. The flange can be produced by folding at the transition to the side faces.

It can be provided that the arrangement comprises a lid arranged on the frame. The lid can have an opening at least in the region of the component. The lid can further have side faces which lie against side faces of the frame. The side faces of the lid can lie at least against half of the frame side faces extending downwards starting from the frame top side.

Border regions of the lid can be arranged between the frame and the lid. It can be provided that the covering is electrically conductively attached to the frame by means of clamping between the lid and the at least one portion of the frame. The attachment of the covering by means of clamping can be effected additionally or alternatively to attachment by means of the adhesive.

The arrangement can further comprise a heat sink which is arranged above the component. The heat sink can be in thermal contact with the component. To provide the thermal contact, a heat-conducting medium having thermally conductive properties (e.g. a heat-conducting paste) can be arranged between the component and the heat sink. In this case, the heat-conducting medium can be arranged directly on the region of the component top side which is not covered by the covering or on the covering which covers substantially the entire component top side.

According to a second aspect, a method for electromagnetic shielding of an electronic component attached to a substrate is provided. The method comprises the step of attaching an electrically conductive frame and the component to the substrate in such a way that the frame frames the component. The method further comprises the step of attaching an electrically conductive covering at least to a portion of a top side of the component and of attaching the electrically conductive covering at least to a portion of the frame in such a way that the covering is in electrical contact with the portion of the frame.

The attaching of the component and/or of the frame can comprise carrying out a reflow process. In this case, solder balls can be attached to a bottom side of the component and/or to a bottom edge of the side faces of the frame, which melt during the reflow process. By carrying out the reflow process, heights, starting from the substrate, of the component top side and also of the frame top side can be reduced in ways different from one another and thus result in a height offset.

The method can further comprise the step of attaching a lid to the frame at least partly covered by the covering. Alternatively or additionally thereto, the method can comprise the step of attaching a heat sink above the component at least partly covered by the covering, wherein the heat sink is brought into thermal contact with the component.

It can be provided that the method is carried out at least partly by an equipping robot. Therefore, according to a third aspect a computer program product which is stored on a computer-readable storage device is provided. The computer program product is operable to cause the equipping robot to carry out the method presented here.

BRIEF DESCRIPTION OF THE DRAWINGS

Further advantages, details and features of the solution described here will become apparent from the following description of exemplary embodiments and also from the figures, in which:

FIG. 1 shows a schematic representation of an exemplary embodiment of an electrically conductive frame which is attached to a substrate in such a way that the frame frames an electronic component;

FIGS. 2A and 2B show schematic representations of an exemplary embodiment of an arrangement for electromagnetic shielding of the electronic component;

FIGS. 4A and 4B show schematic representations of an alternative exemplary embodiment of the arrangement according to FIGS. 2A and 2B;

DETAILED DESCRIPTION

Figure 3A:
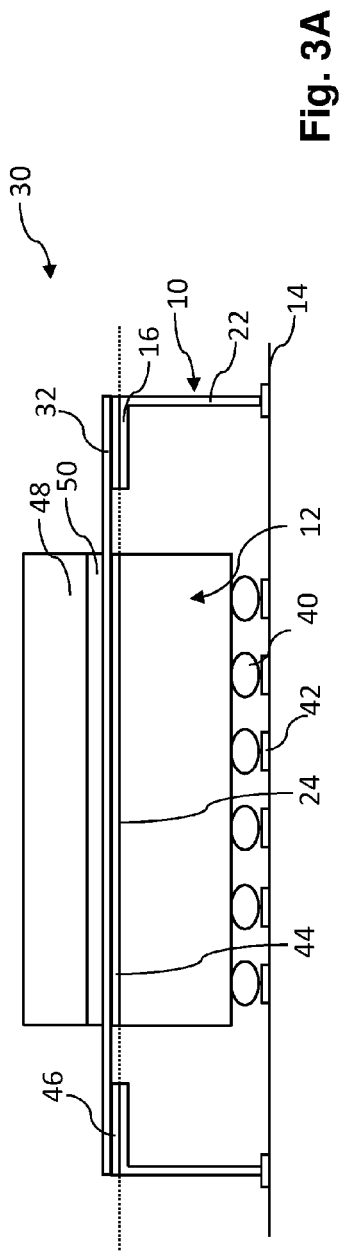
FIGS. 3A to 3C show schematic side views of exemplary embodiments of the arrangement according to FIGS. 2A and 2B.

FIG. 1 shows a perspective representation of a component of an exemplary embodiment of an arrangement for electromagnetic shielding, namely an electrically conductive frame 10, and also an electronic component 12 to be shielded. The frame 10 and also the component 12 are attached to a top side of a substrate 14, for example a printed circuit board. The frame 10 is produced from a metallic material (e.g. sheet steel). The component 12 can be an integrated circuit which is accommodated in a housing (e.g. made of a non-conductive material such as plastic).

The arrangement for electromagnetic shielding of the component 12 presented here can be part of an electronic control unit (ECU). In this case, the component 12 can, for example, be a processor of the electronic control unit or comprise the processor. Furthermore, the substrate 14 can be a printed circuit board. The electronic control unit can be provided for installation in a motor vehicle.

In the exemplary embodiment, the frame 10 comprises a frame top side 16 of flat form, which is arranged parallel to the top side of the substrate 14. In the exemplary embodiment shown, an outer border 18 of the frame top side 16 is configured in the shape of a rectangle. An inner border 20 of the frame top side 16 defines an opening of the frame 10 which is configured in the shape of a smaller rectangle with bevelled corners. In an alternative exemplary embodiment, the outer border 18 and/or the inner border 20 of the frame 10 can assume shapes different therefrom or coincide. The frame 10 further comprises frame side faces 22 which, starting from the outer border 18 of the frame top side 16, extend downwards in the direction of the substrate 14.

The frame 10 is attached to the substrate 14 in such a way that the frame 10 frames the component 12. In this case, a plane defined by the frame top side 16 is substantially identical to a plane in which a top side 24, facing away from the substrate 14, of the component 12 lies. Alternatively thereto, the frame top side 16 can be arranged with a certain (e.g. tolerance-related or intentional) height offset parallel to the component top side 24. The frame 10 is laterally separated from the component 12 by a gap 28.

In FIGS. 2A and 2B, schematic representations of an exemplary embodiment of an arrangement, designated generally by 30, for electromagnetic shielding of the electronic component 12 attached to the substrate 14 are shown. These can be the component 12 and the substrate 14 as explained with reference to FIG. 1. FIGS. 2A and 2B show respectively a perspective exploded view and a perspective view of the arrangement 30 from above.

The arrangement 30 comprises the electrically conductive frame 10 (cf. the exemplary embodiment according to FIG. 1), an electrically conductive covering 32 and a lid 34.

The covering 32 is arranged above the component top side 24 and above the top side 16 of the frame 10. In the exemplary embodiment shown in FIGS. 2A and 2B, the covering 32 is configured in such a way that the covering 32 covers the entire top side 24 of the component 12. Nevertheless, in order to dissipate a heat generated by the component 12 via the covering 32 (e.g. to a heat sink), it can be provided that the covering 32 has thermally conductive properties in addition to the electrical conductivity. Furthermore, the covering 32 can, at least in this case, be thermally conductively attached at least to a portion of the component top side 24.

In the exemplary embodiment shown in FIGS. 2A and 2B, the covering 32 is furthermore configured in such a way that the covering 32 covers substantially the entire top side 16 of the frame 10. Alternatively thereto, it can be provided that the covering 32 does not cover, for example, a region running along the outer border 18 of the frame top side 16. The region can comprise, for example, between ⅓ and ⅕ of a frame width extending between the outer border 18 and the inner border 20 of the frame top side 16.

The lid 34 comprises a lid top side 36 and lid side faces 38. The lid top side 36 has an opening. In this case, it can be provided that the lid top side 36 has the opening at least in the region above the component 12 arranged below the lid top side 36. The lid side faces 38, starting from an outer border of the lid top side 36, extend downwards in the direction of the substrate 14.

As shown in FIG. 2B, the lid 34 is attached (e.g. in a form-fitting manner) to the frame 10. In this case, the lid top side 36 is arranged substantially parallel to the frame top side 16. Furthermore, the side faces 38 of the lid 34 lie against the side faces 22 of the frame 10. In the exemplary embodiment shown, the side faces 38 of the lid 34 cover substantially the entire side faces 22 of the frame 10. Border regions of the covering 32 are arranged between the top side 16 of the frame 10 and the lid 34.

In the exemplary embodiment shown in FIGS. 2A and 2B, the electromagnetic shielding of the component 12 is achieved by an electrical contact between the covering 32, covering substantially the entire component top side 24, and the frame 10 framing the component 12. In this case, the covering 32 is electrically conductively attached at least to a portion of the frame 10 (e.g. clamped by means of the lid 34 and/or attached by means of an adhesive).

Figure 3B:
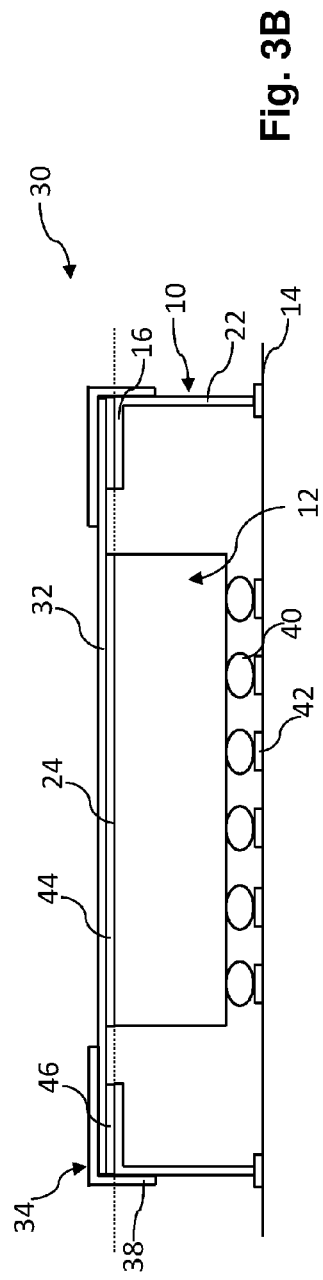
Figure 3C:
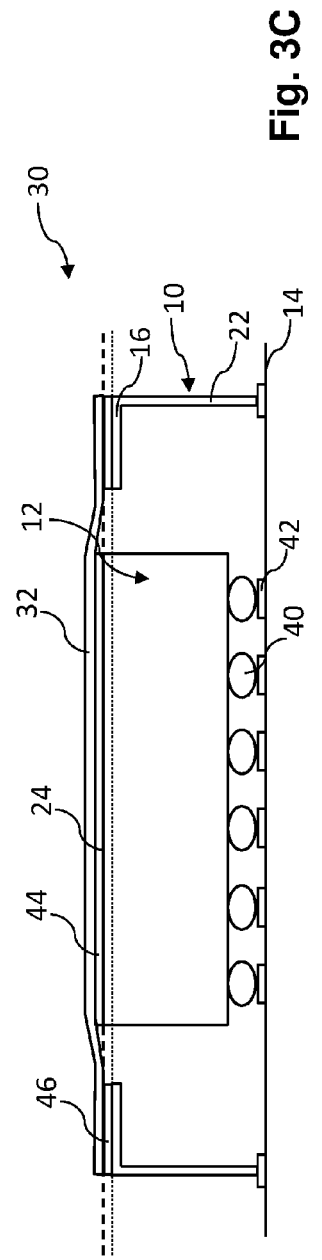

FIGS. 3A to 3C show schematic side views of exemplary embodiments of the arrangement 30 for electromagnetic shielding of the electronic component 12 attached to the substrate 14 according to FIGS. 2A and 2B. The arrangement 30 shown in FIGS. 3A to 3C comprises the electrically conductive frame 10 and the electrically conductive covering 32 (cf. exemplary embodiments in FIGS. 2A and 2B).

In the exemplary embodiments shown in FIGS. 3A to 3C, the component 12 has, on a bottom side facing the substrate 14, contacts in the form of solder balls 40. In this case, the component 12 can comprise a ball grid array (BGA). In the state of the component 12 when attached to the substrate 14, the molten solder balls 40 are connected to contact pads 42 of the substrate 14. It can additionally be provided that the frame 10 is likewise attached to the substrate 14 by means of molten solder balls 40 (not shown) or otherwise.

The top side 16 of the frame 10 is configured as a flange extending inwards from the side faces 22 of the frame 10. The flange extends in this case substantially perpendicularly to the frame side faces 22.

The covering 32 is attached without a gap to the top side 24 of the component 12 and also to the top side 16 of the frame 10. In this case, in the exemplary embodiments shown in FIGS. 3A to 3C, the covering 32 is attached substantially to the entire top side 24 of the component 12 and substantially to the entire top side 16 of the frame 10. In an alternative exemplary embodiment, it can be provided to attach the covering 32 only to a portion of the top side 24 of the component 12 and/or only to a portion of the top side 16 of the frame 10.

As shown in FIGS. 3A to 3C, the covering 32 is attached to the component 12 by means of an adhesive layer 44 applied to the top side 24 of the component 12. The covering 32 is furthermore attached to the frame 10 by means of an adhesive layer 46 applied to the frame top side 16. An adhesive layer thickness extending between the component top side 24 and the covering 32 corresponds in this case approximately to an adhesive layer thickness extending between the frame top side 16 and the covering 32. Alternatively thereto, the thickness of the adhesive layer 46 applied to the frame top side 16 can be different from the adhesive layer 44 applied to the component top side 24. The adhesive layer thicknesses can assume values between 2 μm and 100 μm, in particular between approximately 10 μm and 50 μm. The adhesive layers 44, 46 can thus each have, for example, a thickness of approximately 25 μm.

The adhesive used for the adhesive layers 44, 46 can be in the form of an adhesive foil. The adhesive can furthermore be electrically conductive and thermally conductive. The adhesive can, for example, be an ECATT (Electrically Conductive Adhesive Transfer Tape). Alternatively thereto, the attachment of the covering 32 to the top side 16 of the frame 10 can be effected by means of an electrically conductive adhesive and/or the attachment of the covering 32 to the top side 24 of the component 12 can be effected by means of a thermally conductive adhesive.

The arrangement 30 shown in FIG. 3A comprises a heat sink 48 which is arranged above the component 12. The heat sink 48 is thermally connected to the component 12 by means of a heat-conducting medium 50 (e.g. a heat-conducting paste) arranged between the covering 32 and the heat sink 48. The heat-conducting medium 50 is in this case arranged substantially on the entire component top side 24 covered by the covering 32. Alternatively thereto, the heat-conducting medium can be arranged only on a region of the component top side 16 covered by the covering 32. In the exemplary embodiment shown in FIG. 3A, the heat generated by the component 12 can thus be dissipated to the heat sink 48 via the (at least) thermally conductive adhesive layer 44, the thermally conductively formed covering 32 and the heat-conducting medium 50. In an alternative exemplary embodiment, it can, for example, be provided to arrange the heat sink 48 directly (without the heat-conducting medium 50) on the covering 32. It should be pointed out that the arrangements 30 according to the exemplary embodiments shown in FIGS. 3B and 3C can also comprise the heat sink 48 and the heat-conducting medium 50.

The arrangement 30 shown in FIG. 3B further comprises the (optional) lid 34, as described with reference to FIGS. 2A and 2B. In this case, the lid 34 is attached to the frame 10 in such a way that the border region, arranged between the frame top side 16 and the lid 34, of the covering 32 is clamped between the frame 10 and the lid 34. In an alternative exemplary embodiment to that shown in FIG. 3B, it can therefore be provided to attach the covering 32 to the frame 10 by means of the clamping, without the adhesive layer 46 applied to the frame top side 16.

In the exemplary embodiments according to FIGS. 3A and 3B, the plane in which the frame top side 16 lies (represented by the dotted line) is substantially identical to the plane in which the component top side 24 lies. In contrast thereto, the component top side 24 (in the plane represented by the dashed line) is arranged, in the exemplary embodiment shown in FIG. 3C, with a height offset parallel above the frame top side 16 (in the plane represented by the dotted line). Alternatively thereto, the component top side 24 can be arranged with a height offset parallel below the frame top side 16.

The covering 32 attached to the frame top side 16 and to the component top side 24 bridges in this case the height offset shown in FIG. 3C. In this case, it can be provided to configure the covering 32 in such a way that the covering 32 bridges a height offset between approximately 0 μm and 500 μm. It can also be provided that the covering bridges a height offset up to 200 μm or up to 300 μm.

To bridge the height offset, the covering 32 is flexibly formed. Concretely, it is provided that the covering 32 is bendably formed. The flexibility of the covering 32 can be dependent on a property of the covering 32, such as, for example, on a material and/or on a thickness. In the exemplary embodiment, the covering 32 comprises a metal foil. This can be a copper foil for example. Alternatively or additionally thereto, the metal foil can comprise other components. It can be provided that the covering 32 has a thickness of between approximately 20 μm and 250 μm. The thickness of the covering 32 can assume, for example, values between approximately 20 μm and 100 μm (e.g. 70 μm).

In the exemplary embodiments shown in FIGS. 3A to 3C, the covering 32 is attached to the top side 16 of the frame 10. Alternatively or additionally thereto, it can be provided to attach the covering 32 to the side faces 22 of the frame 10. In this case, the covering 32 can comprise a region projecting laterally beyond the frame top side 16. The region of the covering 32 projecting laterally beyond the frame top side 16 can be attached to the frame 10, for example by means of adhesive and/or by means of clamping between the frame side faces 22 and the side faces 38 of the lid 34 (cf. the exemplary embodiment according to FIG. 3B). At least in this case, the top side 16 of the frame 10 can be configured as an edge, facing away from the substrate 14, of the side faces 22 of the frame 10.

FIGS. 4A and 4B show representations of a further exemplary embodiment of the arrangement 30 for electromagnetic shielding of the electronic component 12 attached to the substrate 14 according to FIGS. 2A to 3C. FIGS. 4A and 4B show respectively a perspective exploded view and a perspective view of the arrangement 30 from above.

In contrast to the covering 32 described with reference to FIGS. 2A to 3C, the covering 52 shown in FIGS. 4A and 4B has a plurality of apertures 54. The top side 24, covered by the covering 52, of the component 12 is not covered by the covering 52 in subregions determined by the apertures 54.

In the exemplary embodiment shown in FIGS. 4A and 4B, the apertures 54 are configured in the shape of circles. Furthermore, the apertures 54 are arranged on lines running substantially parallel to one another (in the manner of a matrix). The regions of the covering 52 which lie between the apertures 54 are configured as webs. A relationship between a distance between centres of two adjacent apertures 54 and a diameter of an aperture 54 can in this case assume, for example, values between 1.5 and 5.0 (e.g. 3.0). In another exemplary embodiment, the apertures 54 can be configured in the shape of another oval or a polygon (e.g. a square). Furthermore, the number of apertures 54 and/or their arrangement can vary. The apertures 54 can determine a non-covered (left-open) subregion, of which the area proportion of a surface of the covering 52 assumes, for example, between 10% and 60% (e.g. 20%). A centre line running through the subregions can have, for example, lengths between 0.5 mm and 5 mm (e.g. 3 mm).

In FIG. 4A, an adhesive layer 56 comprised by the arrangement 30 and configured as adhesive foil (tape) is shown. The adhesive layer 56 is configured for gap-free attachment of the covering 52 to the top side 24 of the component 12 and to the top side 16 of the frame 10. The adhesive layer 56 likewise has apertures 58. In other exemplary embodiments, the adhesive layer can be one of the adhesive layers 44, 46, as described with reference to FIGS. 3A to 3C.

In the exemplary embodiment shown in FIGS. 4A and 4B, the apertures 58 of the adhesive layer 56 are configured and arranged in such a way that, on attachment of the adhesive layer 56 and of the covering 52 to the component 12, they coincide with the apertures 54 of the covering 52. In another exemplary embodiment, the apertures 58 of the adhesive layer 56 can be formed differently from the apertures 54 of the covering 52 and/or arranged differently thereto. Thus, for example, it can be provided that the apertures 58 of the adhesive layer 56 have a larger or smaller circumference than the apertures 54 of the covering 52.

The apertures 54 of the covering 52 and apertures 58 of the adhesive layer 56 which are shown in FIGS. 4A and 4B enable gases or gas mixtures (e.g. air) to escape during the attachment of the covering 52. An inclusion of the gases or gas mixtures which increases the thermal resistance of the arrangement can thus be reduced or completely prevented.

Figure 5B:
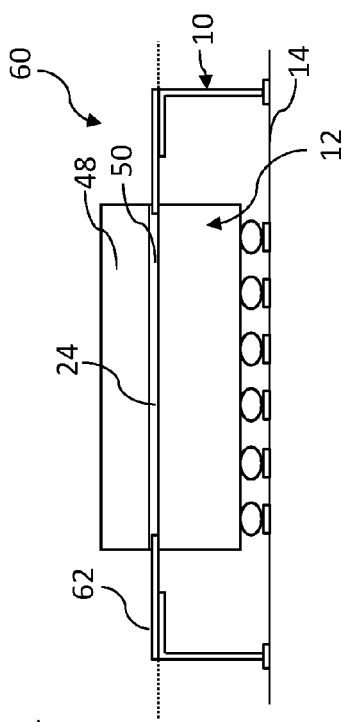
FIGS. 5A to 5C shows schematic representations of an exemplary embodiment of an alternative arrangement to the arrangement according to FIGS. 2A and 2B for electromagnetic shielding of the electronic component.
Figure 5C:
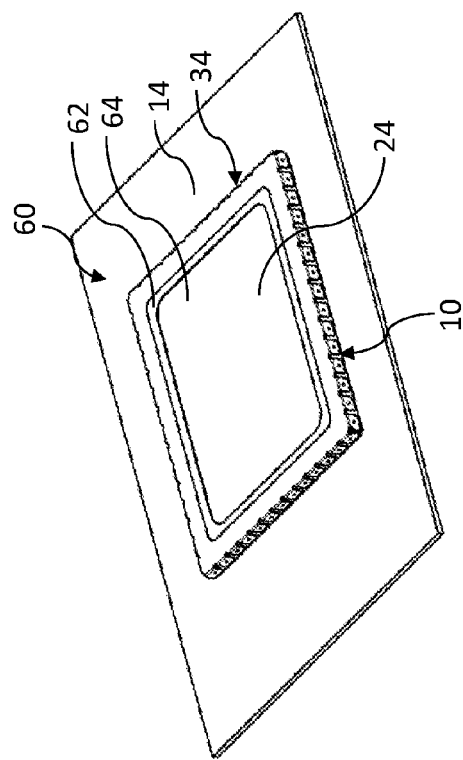
Figure 5A:
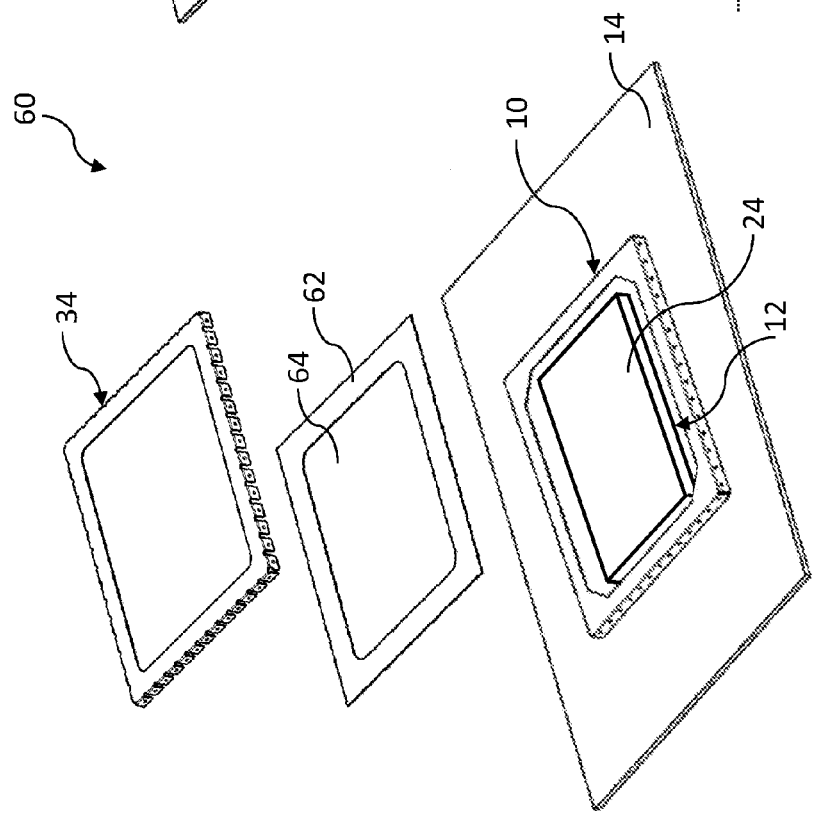

FIGS. 5A to 5C show schematic representations of an exemplary embodiment of an arrangement, designated generally by 60, for electromagnetic shielding of the electronic component 12 attached to the substrate 14 (cf. the exemplary embodiments according to FIGS. 1 to 4B). In this case, FIGS. 5A, 5B and 5C show respectively a perspective exploded view from above, a perspective view from above and a side view of the arrangement 60.

The arrangement 60 shown in FIGS. 5A to 5C comprises the electrically conductive frame 10 and an electrically conductive covering 62. It can be the frame 10 according to the exemplary embodiments shown in FIGS. 1 to 4B.

In contrast to the coverings 32, 52 described with reference to FIGS. 2A to 4B, the covering 62 shown in FIGS. 5A to 5C has an opening 64. The opening 64 is configured in such a way that the covering 62, in the state when attached to the component 12 and to the frame 10, does not cover, i.e. leaves open, a region of the component top side 24. In the exemplary embodiment shown in FIGS. 5A to 5C, the covering 62 covers only an outer border region of the component top side 24. It can be provided that the covering 62 covers, for example, between ⅓ and ⅕ of the component top side 24 in the outer border region thereof.

In the exemplary embodiment shown in FIGS. 5A to 5C, the component 12 has an electrically conductively formed top side 24 (e.g. in the form of a metallic coating). For electromagnetic shielding of the component 12, the covering 62 is in electrical contact with the component top side 24. For this purpose, the covering 62 is attached without a gap (e.g. by means of an electrically conductive adhesive) at least to a portion in the outer border region of the component top side 24. In another exemplary embodiment, it can be provided that the top side 24 of the component 12 is electrically conductively formed and in electrical contact with the covering 62 only in a region to which the covering 62 is not attached.

It can further be provided that the opening 64 of the exemplary embodiment shown in FIGS. 5A to 5C is replaced by apertures 54 and webs running between the apertures 54, as described with reference to FIGS. 4A to 4C. In this case, a centre line running respectively through the subregions can have, for example, lengths between 0.5 mm and 10 mm (e.g. 3 mm).

The arrangement 60 shown in FIGS. 5A and 5B further comprises the lid 34 as an option. This can be the lid 34 explained with reference to FIGS. 2A, 2B and 3B. It can be provided to attach the covering 62 to the frame 10 (e.g. additionally or alternatively to the adhesive) by means of clamping between the frame 10 and the lid 34.

As shown in FIG. 5C, the arrangement 60 can further comprise the heat sink 48 and the heat-conducting medium 50 (cf. the exemplary embodiments according to FIGS. 3A to 3C). In contrast to the exemplary embodiment shown in FIG. 3A, the heat-conducting medium 50 is arranged, in the region of the component top side 24 not covered by the covering 62, directly on the component top side 24.

Figure 6:
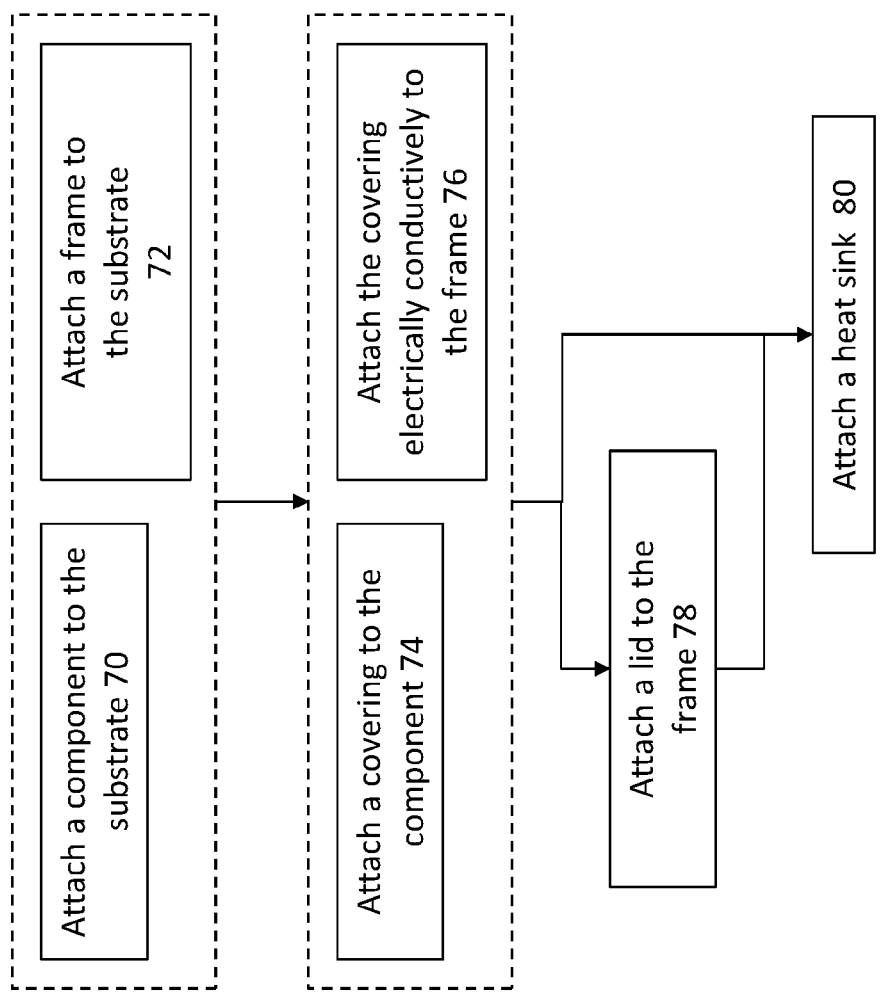
FIG. 6 shows a flow diagram of exemplary embodiments of a method for electromagnetic shielding of the electronic component.

FIG. 6 shows a flow diagram of exemplary embodiments of a method for electromagnetic shielding of the electronic component 12 attached to the substrate 14, according to FIGS. 1 to 5C. The method can be provided for being carried out by an equipping robot.

In a first method step 70 the component 12 is attached to the substrate 14. In a second method step 72 the frame 10 (cf. the exemplary embodiments according to FIGS. 1 to 5C) of the arrangement 30, 60 for electromagnetic shielding explained with reference to the FIGS. 2A to 5C is attached to the substrate 14 in such a way that the frame 10 frames the component 12. Alternatively thereto, it can be provided to carry out the method steps 70 and 72 differently from the order described (e.g. simultaneously).

At least the component 12 can be attached to the substrate 14 by means of a reflow process (step 70). In this case, the solder balls 40 attached to the bottom side of the component 12 can (after arranging the component 12 on the substrate 14) be melted (cf. the exemplary embodiments in FIGS. 3A to 3C and 5C). The attachment of the frame 10 (step 72) to the substrate 14 can be effected in the same way by means of the reflow process or differently therefrom (e.g. by means of through-hole technology).

Owing to the melting of the solder balls 40, a height, starting from the substrate 14, of a top side of a component attached by means of the reflow process can be reduced. Thus, the heights of the component top side 24 and of the frame top side 16 described with reference to FIGS. 2A to 5C can be reduced in ways different from one another. A height offset, present before carrying out the reflow process, between the component top side 24 and the frame top side 16 can be reduced or increased (e.g. due to tolerance).

In a further method step 74 the electrically conductive covering 32, 52, 62 (cf. the exemplary embodiments in FIGS. 2A to 5C) is attached at least to a portion of the top side 24 of the component 12. Furthermore, in a method step 76 the electrically conductive covering 32, 52, 62 is attached at least to a portion of the frame 10 in such a way that the covering 32, 52, 62 is in electrical contact with the frame 10. The attaching of the covering 32, 52, 62 to the component top side 24 (step 74) and the attaching of the covering 32, 52, 62 to the frame 10 (step 76) can also be effected in the order described or differently therefrom (e.g. simultaneously). As explained with reference to FIGS. 3A to 3C, the covering 32, 52, 62 bridges the height offset, present after the attaching of the component 12 (step 70) and after the attaching of the frame 10 (step 72) to the substrate 14, between the component top side 24 and the frame top side 16.

By attaching the covering 32, 52, 62 in the steps 74 and 76, the electromagnetic shielding of the component 12 is completed. The electromagnetic shielding results from the electrical contact between the covering 32, 52, covering substantially the entire component top side 24, and the frame 10 (cf. the exemplary embodiments according to FIGS. 2A to 4B). Alternatively thereto, the electromagnetic shielding can result by means of the electrical contact between the electrically conductive component top side 24 and the covering 62 and also between the covering 62 and the frame 10 (cf. the exemplary embodiments according to FIGS. 5A and 5C).

In a further method step 78 the lid 34 described with reference to FIGS. 2A to 5C is attached to the frame 10 covered at least partly by the covering 32, 52, 62. The attaching of the lid 34 to the frame 10 (step 78) can correspond to the attaching of the covering 32, 52, 62 to the frame 10 (step 76). In this case, the covering 32, 52, 62 can be attached by means of clamping between the frame 10 and the lid 34, as explained with reference to the exemplary embodiments shown in FIGS. 3A to 3C. Alternatively thereto, it can be provided that the attaching of the lid 34 to the frame 10 (step 78) can be effected additionally to the attaching of the covering 32, 52, 62 (e.g. by means of adhesive) to the frame 10 (step 78) or that the attaching of the lid 34 (step 70) is dispensed with.

Finally, in a last method step 80 the heat sink 48 described with reference to FIGS. 3A and 3C can be attached above the component 12 covered at least partly by the covering 32, 52, 62. In this case, the heat sink 48 is brought into thermal contact with the component 12 (e.g. by means of the heat-conducting medium 50).

With reference to the preceding exemplary embodiments, the component 12 and also the arrangement 30, 60 for electromagnetic shielding can be attached to the substrate 14, with no gap having to be tolerated in the case of a height difference between the top side 16 of the frame 10 above the top side 24 of the component 12. Thus, an electromagnetic shielding of the component 12 and also a thermal dissipation of the heat produced by the component 12 can be achieved and at the same time the overall height of the arrangement 30, 60 can be minimised.

The exemplary embodiments described provide various features and uses of a solution regarding an arrangement and a method for electromagnetic shielding. In a different exemplary embodiment these features can, of course, also be combined as desired.

The invention claimed is:

1. An arrangement for electromagnetic shielding of an electronic component attached to a substrate, comprising:
    an electrically conductive frame which is attached to the substrate in such a way that the frame frames the component, the frame having a top side lying in a first plane; and
    an electrically conductive covering which is attached at least to a portion of a top side of the component, and which is electrically conductively attached at least to a portion of the frame,
    the top side of the component lying in a second plane with a height offset to the first plane, so that the second plane is further away from the substrate than the first plane.

2. The arrangement according to claim 1, wherein the covering is flexibly formed.

3. The arrangement according to claim 1, wherein the covering has a thickness of at most 250 μm.

4. The arrangement according to claim 1, wherein the covering is or comprises a metal foil.

5. The arrangement according to claim 1, wherein the covering is configured to bridge the height offset between the top side of the component and the top side of the frame.

6. The arrangement according to claim 5, wherein the covering bridges the height offset up to 500 μm.

7. The arrangement according to claim 1, wherein the covering is attached without a gap to the top side of the component.

8. The arrangement according to claim 1, further comprising:
    an adhesive between the covering and the top side of the component and/or the frame to attach the covering to the top side of the component and/or to the frame.

9. The arrangement according to claim 1, wherein the covering has at least one aperture.

10. The arrangement according to claim 1, wherein the covering covers substantially the entire top side of the component.

11. The arrangement according to claim 10, wherein the covering is attached substantially to the entire top side of the component.

12. The arrangement according to claim 10, further comprising:
    a thermally conductive adhesive or a thermally and electrically conductive adhesive between the covering and the top side of the component to attach the covering to the top side of the component.

13. The arrangement according to claim 1, wherein the covering does not cover a portion of the top side of the component, the portion being spaced from a border of the top side of the component.

14. The arrangement according to claim 13, wherein the top side of the component, at least in the portion to which the covering is not attached, is electrically conductively formed and is in electrical contact with the covering.

15. The arrangement according to claim 13, further comprising:
    an electrically conductive adhesive or an electrically and thermally conductive adhesive between the covering and the top side of the component to attach the covering to the top side of the component.

16. The arrangement according to claim 1, wherein the top side of the frame is configured as a flange extending from side faces of the frame in the first plane.

17. The arrangement according to claim 1, further comprising a lid arranged on the frame, wherein border portions of the covering are arranged between the frame and the lid.

18. The arrangement according to claim 17, wherein the lid has an opening at least in the region of the component.

19. The arrangement according to claim 17, wherein the lid has side faces which lie against side faces of the frame, the side faces of the frame extending substantially perpendicular to the first plane.

20. The arrangement according to claim 17, wherein the lid is configured to clamp the covering to the at least one portion of the frame to electrically conductively attach the covering to the frame.

21. The arrangement according to claim 1, further comprising a heat sink which is arranged above the component and is in thermal contact with the component.

22. A method for electromagnetic shielding of an electronic component attached to a substrate, comprising the steps:
    attaching an electrically conductive frame and the component to the substrate in such a way that the frame frames the component, the frame having a top side lying in a first plane;
    attaching an electrically conductive covering at least to a portion of a top side of the component, the top side of the component lying in a second plane with a height offset to the first plane, so that the second plane is further away from the substrate than the first plane; and
    attaching the electrically conductive covering at least to a portion of the frame in such a way that the covering is in electrical contact with the portion of the frame.

23. The method according to claim 22, wherein the attaching of the component and/or of the frame comprises carrying out a reflow process.

24. The method according to claim 22, further comprising the step of attaching a lid to the frame at least partly covered by the covering.

25. The method according to claim 22, further comprising the step of attaching a heat sink above the component, wherein the heat sink is brought into thermal contact with the component.

26. A computer program product which is stored on a computer-readable storage medium, operable to cause an equipping robot to carry out the method according to claim 22.

* * * * *